US012711069B2

(12) United States Patent
Kowles

(10) Patent No.: US 12,711,069 B2
(45) **Date of Patent: *Aug. 18, 2026**

(54) POWER LOSS PROTECTION IN MEMORY SUB-SYSTEMS

(71) Applicant: Micron Technology, Inc., Boise, ID (US)

(72) Inventor: Andrew M. Kowles, Boise, ID (US)

(73) Assignee: Micron Technology, Inc., Boise, ID (US)

(*) Notice: Subject to any disclaimer, the term of this patent is extended or adjusted under 35 U.S.C. 154(b) by 57 days.

This patent is subject to a terminal disclaimer.

(21) Appl. No.: 18/793,458

(22) Filed: Aug. 2, 2024

(65) Prior Publication Data

US 2024/0394185 A1 Nov. 28, 2024

Related U.S. Application Data

(63) Continuation of application No. 17/702,305, filed on Mar. 23, 2022, now Pat. No. 12,061,543, which is a
(Continued)

(51) Int. Cl.
*G06F 12/0804* (2016.01)
*G11C 29/44* (2006.01)

(52) U.S. Cl.
CPC .......... *G06F 12/0804* (2013.01); *G11C 29/44* (2013.01); *G06F 2212/1032* (2013.01)

(58) Field of Classification Search
CPC ......... G06F 12/0804; G06F 2212/1032; G06F 12/0875; G06F 12/0238; G06F 12/0246; G06F 2212/202; G06F 2212/2022; G06F 2212/7208; G06F 3/0625; G06F 3/0638; G06F 3/0653; G06F 3/0656;
(Continued)

(56) References Cited

U.S. PATENT DOCUMENTS 10,725,912 B2 7/2020 Kowles
11,301,381 B2 4/2022 Kowles
(Continued)

FOREIGN PATENT DOCUMENTS

CN 102597910 7/2012
CN 105022587 11/2015
(Continued)

OTHER PUBLICATIONS

"Chinese Application Serial No. 201911319242.6, Office Action mailed Mar. 23, 2023", with English translation, 13 pages.

*Primary Examiner* — James C Kerveros
(74) *Attorney, Agent, or Firm* — Schwegman Lundberg & Woessner, P.A.

(57) ABSTRACT

Aspects of the present disclosure provide systems and methods for improved power loss protection in a memory sub-system of a device. In particular, a power loss protection component allocates a portion of the memory sub-system to non-volatile memory. Responsive to detecting a trigger event at the device, wherein the trigger event may include asynchronous power loss of the device, the power loss protection component detects data written to a volatile cache of the memory sub-system, retrieves the data from the volatile cache, and writes the data to the portion of the memory sub-system allocated to the non-volatile memory.

20 Claims, 5 Drawing Sheets

Related U.S. Application Data continuation of application No. 16/912,318, filed on Jun. 25, 2020, now Pat. No. 11,301,381, which is a continuation of application No. 16/226,282, filed on Dec. 19, 2018, now Pat. No. 10,725,912.

(58) Field of Classification Search

CPC ..... G06F 3/0659; G06F 3/0679; G11C 29/44; G11C 29/50012; G11C 29/702

USPC .......................................................... 714/718

See application file for complete search history.

(56) References Cited

U.S. PATENT DOCUMENTS

| | | | | |
|---|---|---|---|---|
| 12,061,543 | B2 | 8/2024 | Kowles | |
| 2009/0193193 | A1 | 7/2009 | Kern | |
| 2010/0202238 | A1 | 8/2010 | Moshayedi et al. | |
| 2012/0023318 | A1 | 1/2012 | Xing et al. | |
| 2014/0129759 | A1 | 5/2014 | Sauber et al. | |
| 2014/0195458 | A1 | 7/2014 | Rizzi et al. | |
| 2015/0056475 | A1 | 2/2015 | Adrian et al. | |
| 2015/0186281 | A1* | 7/2015 | Cherian | G06F 12/0246 713/340 |
| 2015/0317248 | A1* | 11/2015 | Lamb | G06F 12/0871 711/118 |
| 2018/0032390 | A1 | 2/2018 | Rahmanian et al. | |
| 2018/0060171 | A1 | 3/2018 | Suh | |
| 2019/0384837 | A1 | 12/2019 | Kumar et al. | |
| 2020/0004445 | A1 | 1/2020 | Benisty | |
| 2020/0042066 | A1 | 2/2020 | Li | |
| 2020/0065256 | A1 | 2/2020 | Palmer | |
| 2020/0201761 | A1 | 6/2020 | Kowles | |
| 2020/0244583 | A1 | 7/2020 | Smith et al. | |
| 2020/0327056 | A1 | 10/2020 | Kowles | |
| 2021/0026545 | A1 | 1/2021 | Cheng et al. | |
| 2022/0214970 | A1 | 7/2022 | Kowles | |

FOREIGN PATENT DOCUMENTS

| | | |
|---|---|---|
| CN | 108376120 | 8/2018 |
| CN | 111338566 A | 6/2020 |

* cited by examiner

POWER LOSS PROTECTION IN MEMORY SUB-SYSTEMS

PRIORITY APPLICATION

This application is a continuation of U.S. application Ser. No. 17/702,305, filed Mar. 23, 2022, which is a continuation of U.S. application Ser. No. 16/912,318, filed Jun. 25, 2020, now issued as U.S. Pat. No. 11,301,381, which is a continuation of U.S. application Ser. No. 16/226,282, filed Dec. 19, 2018, now issued as U.S. Pat. No. 10,725,912, of which are incorporated herein by reference in their entirety.

TECHNICAL FIELD

Embodiments of the disclosure relate generally to memory sub-systems and, more specifically, to systems and methods for improved power loss protection in solid-state drives (SSD).

BACKGROUND

A memory sub-system can be a storage system, such as a SSD, and can include one or more memory components that store data. The memory components can be, for example, non-volatile memory components and volatile memory components. In general, a device or host system can utilize the memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
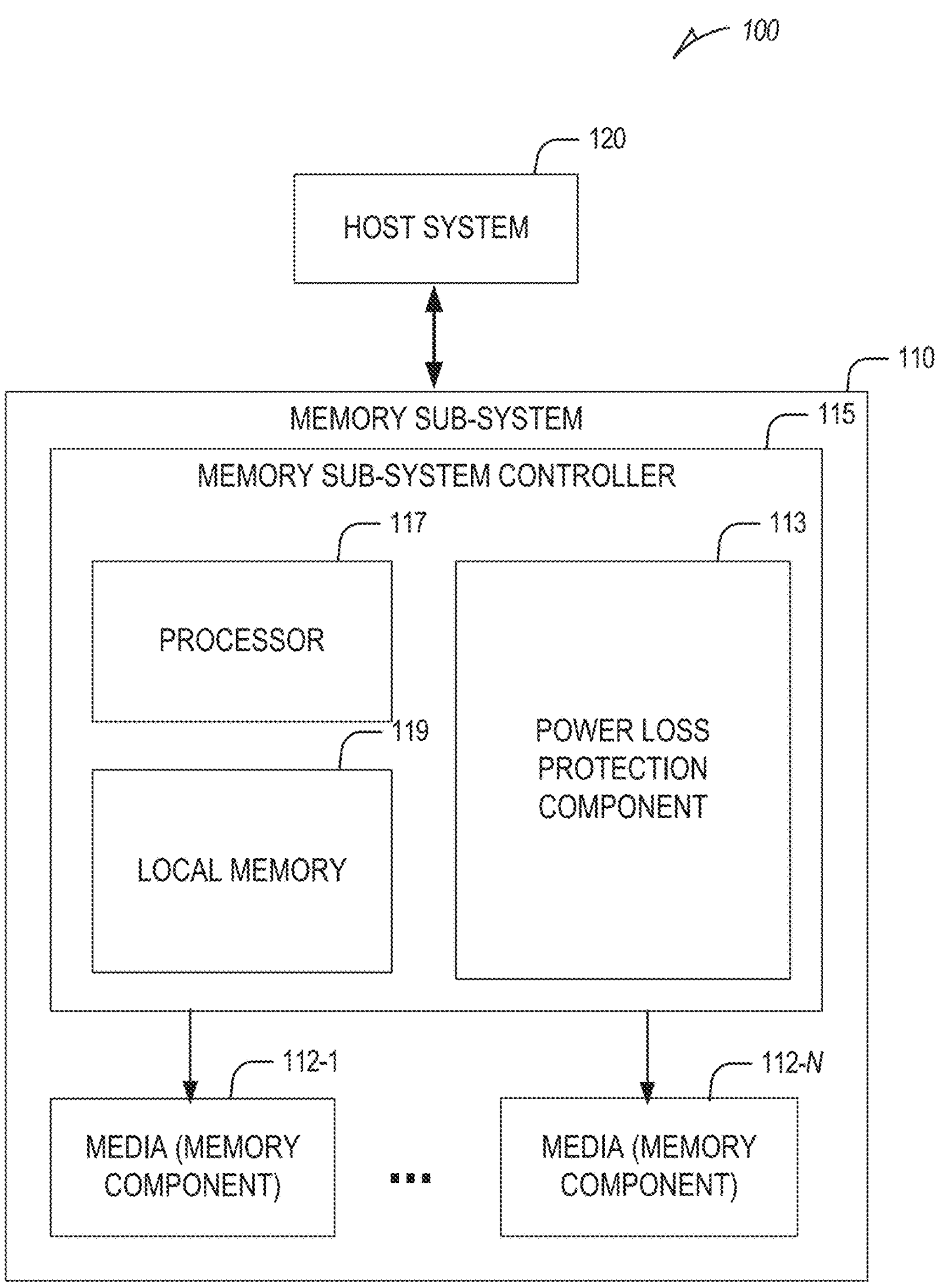
FIG. 1 illustrates an example computing environment that includes a memory sub-system, in accordance with some embodiments of the present disclosure.

Aspects of the present disclosure are directed to systems and methods for improved power loss protection in a memory sub-system. A memory sub-system is also hereinafter referred to as a "memory device." An example of a memory sub-system is a storage system, such as a SSD. In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Memory sub-systems have become common components in computer systems ranging from music players to large scale distributed cloud systems to mission-critical on-premise server systems for financial and government institutions. As the demands and reliance upon these memory sub-systems increases, data reliability becomes a critical question. Data reliability is often compromised by the type of errors that occur during asynchronous power loss during a memory system operation. Such power failures are common, and can lead to several non-intuitive behaviors. Asynchronous power loss can include situations where a power loss at the device is not preceded by any shutdown operations or notification. In such situations, the memory sub-systems of the device is challenged to perform or complete final operations within a very short time window. The failure of these final operations can lead to inflight data and/or internal system metadata information, such as the location or state of data, being lost. Where "data in flight" includes data temporarily buffered or cached in volatile memory, acknowledged as written back to a host, but not yet committed to non-volatile memory (e.g., TLC/QLC/MLC/SLC NAND flash memory, NOR flash memory), as well as data which has been passed to a NAND die.

For example, memory sub-systems such as Flash based memory in devices typically write data in 32 KiB chunks. If a 40 KiB file is written to the flash device, a flash controller must hold a portion of the 40 KiB file (8 KiB) in a volatile buffer until the proper conditions occur to write the remaining portion to a non-volatile memory. Should a sudden power loss occur before the remaining portion is to be saved from the volatile RAM to a non-volatile memory, the remaining portion (e.g., 8 KB) of the file will be lost, potentially corrupting the entire file.

Traditional solutions for managing asynchronous power loss in memory sub-systems for devices include modifying the memory sub-system through the addition of backup power circuitry, such as in the form of capacitors. In such systems, when a device is powered on the capacitors are charged so that in the event of asynchronous power loss, current is discharged from the stored energy in the capacitors to provide additional power to the memory sub-system, therefore allowing the memory sub-system (Controller, DRAM, NV Media) to perform final shut-down operations in order to avoid loss or corruption of data.

Due to the high cost and design restrictions of integrating larger and larger capacitors into memory sub-systems of devices in the form of backup power circuitry, such solutions are not always feasible. Furthermore, backup power systems such as the ones described above are not always a reliable solution for asynchronous power loss events, because of the limits in backup energy that the capacitors can actually store and discharge, along with slower memory circuits and less parallelism. As a result, such solutions are often very bare bones to nonexistent in memory sub-systems of devices found in the client, consumer, and value enterprise markets.

Another conventional, but even less common solution, for preventing data corruption or loss in the event of asynchronous data loss at a memory sub-system of a device is the integration of a Non-volatile Dual-Inline Memory Module, or "NVDIMM," into the memory sub-system. NVDIMM typically include their own dedicated backup power (batteries), and require significant modifications to motherboards and circuitry of devices in order to integrate the discrete memory types presented by an NVDIMM. Thus, the integration of NVDIMM into a memory sub-system poses a number of technical challenges, alongside significant increases in cost. As a result, NVDIMM may not be an appropriate solution for cost-constrained operational profiles (market segments).

Aspects of the present disclosure mitigate the above and other fundamental tradeoffs by providing systems and methods for improved power loss protection in a memory sub-system of a device by speeding the procedures necessary to protecting the device in such cases. In particular, a power loss protection component allocates a portion of the memory sub-system to non-volatile memory, such as NAND flash memory, or more specifically, a single-level cell (SLC) NAND flash memory. Responsive to detecting a trigger event at the device, wherein the trigger event can include asynchronous power loss of the device, the power loss protection component detects data written to a volatile cache of the memory sub-system, retrieves the data from the volatile cache, and writes the data to the portion of the memory sub-system allocated to the NAND flash memory. As discussed herein, "data" refers to both host data, as well as metadata, where host data includes data received at a system across an interface to the storage system, and metadata includes storage system internal metadata generated by the storage system itself, which may indicate information about the status or state of the storage system.

According to certain example embodiments, the allocation of the portion of the memory sub-system to non-volatile memory includes performing a latency test (e.g., a performance test), such as a program time test, upon a set of flash blocks that comprise the memory sub-system, ranking the set of flash blocks based on results of the program time test, identifying the portion of the set of flash blocks based on the ranking, and allocating the portion identified based on the ranking to the non-volatile memory. In such embodiments, "latency" refers to the amount of time spent waiting for a particular operation to be completed, and may therefore be described as a program time test. For example, when a block erase command is sent to the memory sub-system of the device, the device must wait for completion of the operation by the memory sub-system before sending the next command. This time is known as "block erase latency," or tBERS, and is typically on the order of a few milliseconds. "Read latency," or tREAD, is the time (25-50 microseconds) it takes the device to prepare a page of data to be read out after receiving a read command for a particular page address at the memory sub-system. Finally, "program latency," or tPROG, is the period of time that must be observed by the device (~2 ms to ~20 ms) while the memory sub-system programs a page with data.

By performing the program time test upon the flash blocks of the memory sub-system, the power loss protection component can rank the set of flash blocks based on their corresponding read or write speed performance, thereby providing an indication of the "fastest" programming blocks from among the set of flash blocks that comprise the memory sub-system. The power loss protection component then selects those fastest blocks, and allocate the fastest blocks to non-volatile cache. Thus, by choosing the fastest blocks for non-volatile cache, the amount of time required to move data from the volatile cache of the memory sub-system to the non-volatile cache is minimized, therefore diminishing the need for backup power to complete the operation.

FIG. 1 illustrates an example computing environment 100 that includes a memory sub-system 110, in accordance with some embodiments of the present disclosure. The memory sub-system 110 can include media, such as memory components 112-1 to 112-N. The memory components 112-1 to 112-N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112-1 to 112-N when the memory sub-system 110 is coupled with the host system 120 by the PCIe interface. The physical host interface can provide an interface for passing control, address, data, and other signals between the memory sub-system 110 and the host system 120.

The memory components 112-1 to 112-N can include any combination of the different types of non-volatile memory components and/or volatile memory components. An example of non-volatile memory components includes inverted- and (NAND) type flash memory. Each of the memory components 112-1 to 112-N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells, wherein each NAND erase block may be put into any mode, including SLC, MLC, TLC, and QLC. Each of the memory cells can store one or more bits of data (e.g., data blocks) used by the host system 120. Although non-volatile memory components such as NAND type flash memory are described, the memory components 112-1 to 112-N can be based on any other type of memory such as a volatile memory. In some embodiments, the memory components 112-1 to 112-N can be, but are not limited to, random access memory (RAM), read-only memory (ROM), dynamic random access memory (DRAM), synchronous dynamic random access memory (SDRAM), phase change memory (PCM), resistive random access memory (RRAM), magnetic random access memory (MRAM—both toggle and spin transfer torque types), negative-or (NOR) flash memory, electrically erasable programmable read-only memory (EEPROM), and a cross-point, or 3d cross-point array (3DXP) of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory (as well as RRAM, MRAM) can perform a write in-place operation, where a non-volatile memory cell can be programmed without the non-volatile memory cell being previously erased. Furthermore, as noted above, the memory cells of the memory components 112-1 to 112-N can be grouped as data blocks that can refer to a unit of the memory component used to store data.

A memory sub-system controller 115 (hereinafter referred to as "controller") can communicate with the memory components 112-1 to 112-N to perform operations such as reading data, writing data, or erasing data at the memory components 112-1 to 112-N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and instead relies upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112-1 to 112-N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112-1 to 112-N. The controller 115 can further include host interface circuitry to communicate with the host system 120 via the physical host interface. The host interface circuitry can convert the commands received from the host system into command instructions to access the memory components 112-1 to 112-N as well as convert responses associated with the memory components 112-1 to 112-N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112-1 to 112-N.

The memory sub-system 110 includes a power loss protection subsystem 113 that allocates portions of the memory components 112-1 to 112-N to non-volatile memory, such as NAND memory, or more specifically, as single-level cell (SLC) write cache. In some embodiments, the controller 115 includes at least a portion of the power loss protection subsystem 113. For example, the controller 115 can include a processor 117 (processing device) configured to execute instructions stored in local memory 119 for performing the operations described herein. In some embodiments, the power loss protection subsystem 113 is part of the host system 110, an application, or an operating system.

The power loss protection subsystem 113 handles the allocation of portions of memory components to volatile and non-volatile memory based on one or more latency tests performed upon the memory components 112-1 to 112-N. The power loss protection subsystem 113 includes (or is in communication with) one or more supplemental components to perform latency tests upon the memory components 112-1 to 112-N in order to determine a performance of the memory components (e.g., a tPROG speed), and to rank the memory components 112-1 to 112-N based on their corresponding performance. Based on the ranking, the power loss protection subsystem 113 identifies a portion of the memory components 112-1 to 112-N (e.g., the fastest memory components from among the memory components 112-1 to 112-N), and allocates the fastest portion to non-volatile memory. Further details with regards to the operations of the power loss protection subsystem 113 are described below.

Figure 2:
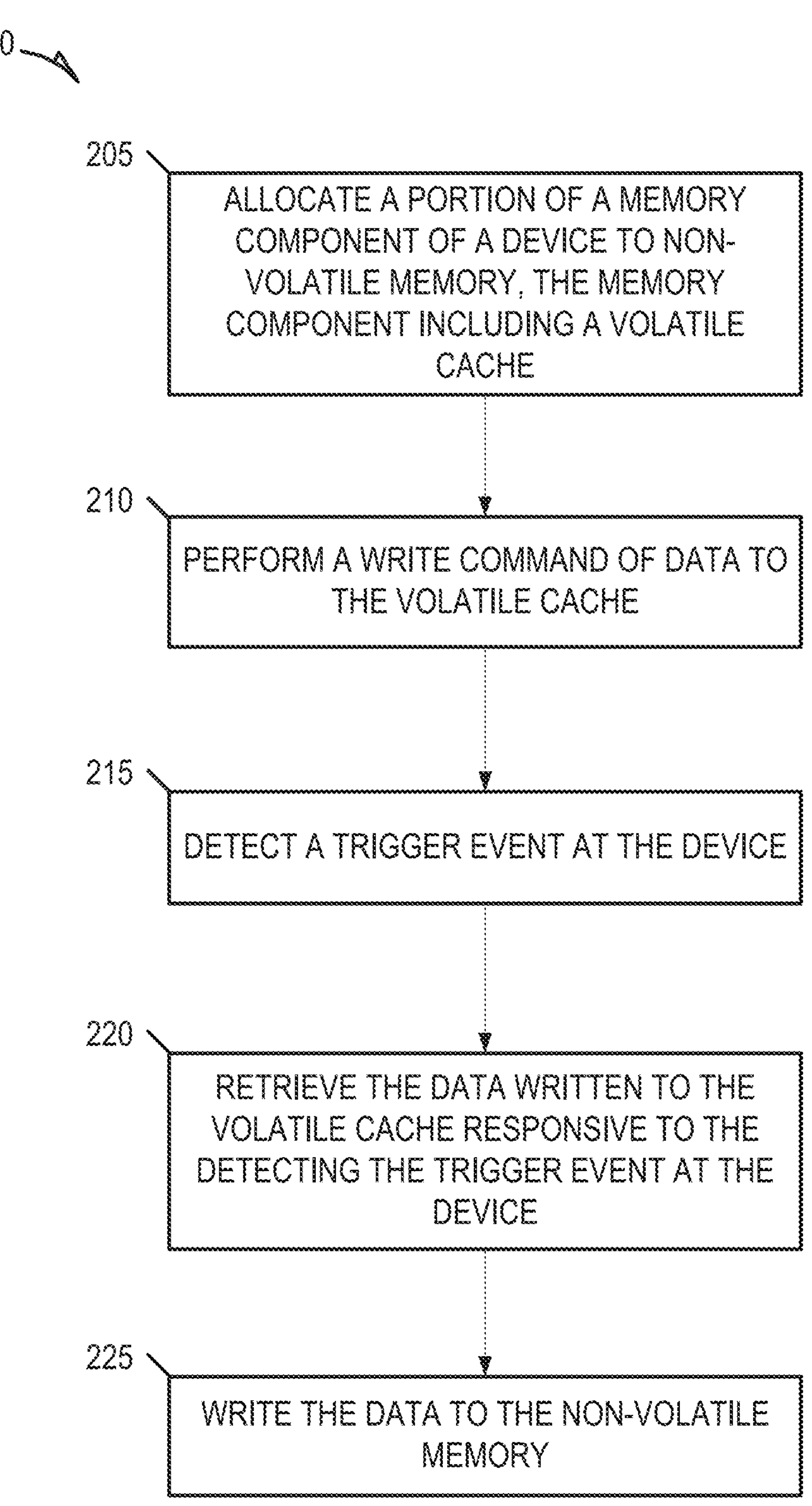
FIG. 2 is a flow diagram of an example method to allocate a portion of a memory sub-system for asynchronous power loss protection, in accordance with some embodiments of the present disclosure.

FIG. 2 is a flow diagram of an example method 200 to allocate a portion of a memory sub-system for asynchronous power loss protection, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the power loss protection subsystem 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the power loss protection subsystem 113 allocates a portion of the memory components 112-1 to 112-N to non-volatile memory, while another portion of the memory components 112-1 to 112-N remains allocated to a volatile cache. Further details regarding the allocation of the portion of the memory components 112-1 to 112-N are discussed with reference to FIG. 3.

For example, in some embodiments, the portion of the memory components 112-1 to 112-N allocated by the power loss protection subsystem 113 to non-volatile memory can be allocated to NAND flash memory, or more specifically, to SLC NAND flash memory. While SLC NAND flash memory can have some compromises compared to other options (e.g., multi-level cell), SLC NAND flash memory provides the advantage of accuracy, reliability, and most importantly, speed.

At operation 210, the controller 115 receives a command (e.g., from the host system 120), and converts the command to operations or instructions. The operations or instructions cause the memory sub-system 110 to store data within the portion of the memory components 112-1 to 112-N to the volatile cache.

At operation 215, the power loss protection subsystem 113 detects a trigger event. For example, the trigger event can include asynchronous power loss to the memory sub-system 110, or to a device in communication with the memory sub-system 110.

Responsive to the power loss protection subsystem 113 detecting the trigger event, at operation 220, the power loss protection subsystem 113 causes the memory sub-system 110 to access the data written to the portion of the memory components 112-1 to 112-N allocated to the volatile cache, and at operation 225, causes the memory sub-system 110 to write the data to the portion of the memory components 112-1 to 112-N allocated to non-volatile memory, and more specifically, to the SLC NAND memory.

Thus, by allocating a portion of the memory components to the "highest performance" SLC NAND memory, the amount of time (and likewise current) required to move the data from volatile to non-volatile memory is be reduced.

Figure 3:
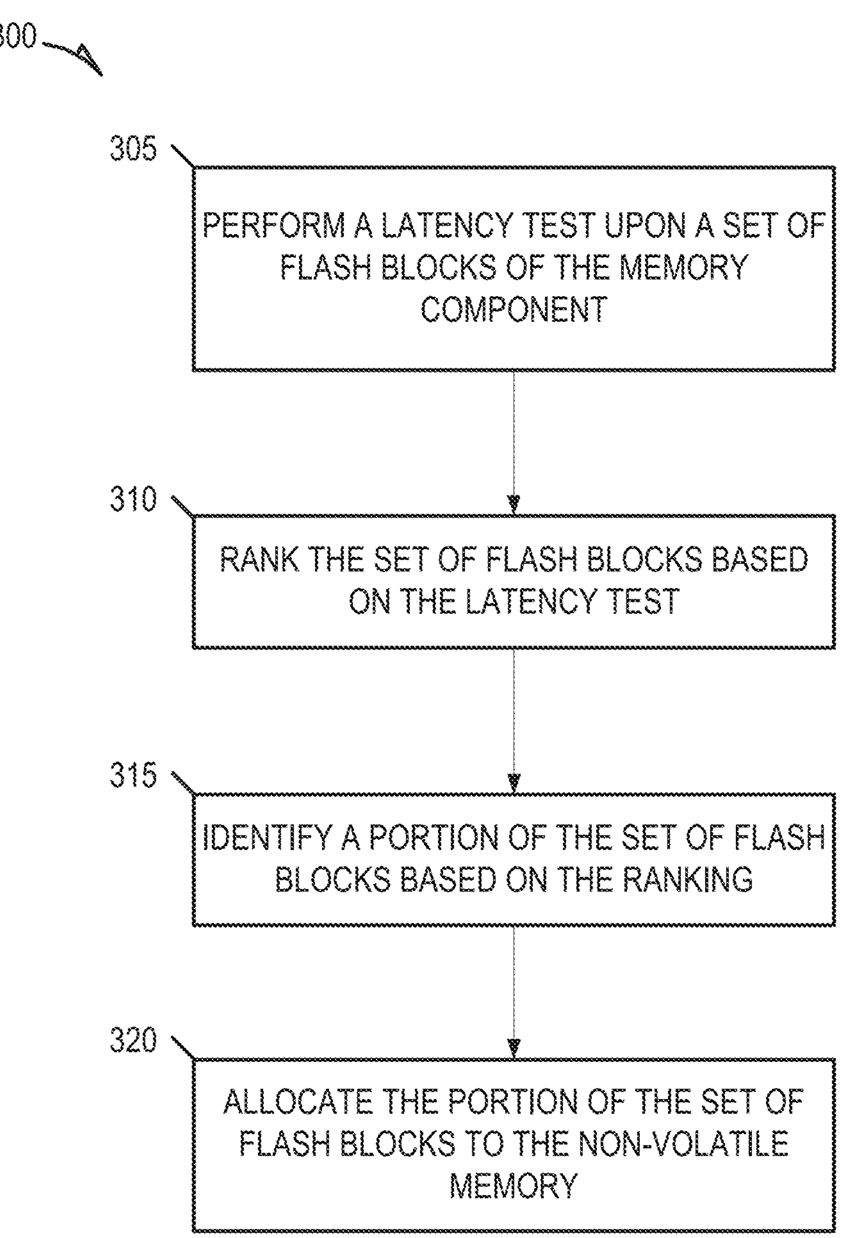
FIG. 3 is a flow diagram of an example method to allocate a portion of a memory sub-system for asynchronous power loss protection, in accordance with some embodiments of the present disclosure.

FIG. 3 is a flow diagram of an example method 300 to allocate a portion of a memory sub-system for asynchronous power loss protection, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the power loss protection subsystem 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the power loss protection subsystem 113 performs a latency test upon the memory components 112-1 to 112-N. In some embodiments the memory components 112-1 to 112-N comprise a set of flash blocks, and the program time test performed by the power loss protection subsystem 113 includes a latency test that determines a program latency (tPROG), block erase latency (tBERS), or read latency (tR) of each flash block from among the set of flash blocks. By performing the program time test upon the memory components 112-1 to 112-N, the power loss protection subsystem 113 determines corresponding performances of each memory component in order to identify the "highest performance" memory components from among the memory components 112-1 to 112-N.

At operation 310, the power loss protection subsystem 113 ranks the memory components 112-1 to 112-N based on their corresponding performance on the program time test, such that the highest ranked memory components have the lowest read or write speeds (i.e., tPROG, tBERS, or tR), are therefore the fastest. By doing so, at operation 315, the power loss protection component identifies the highest performance portion from among the memory components 112-1 to 112-N. For example, the power loss protection components can identify the fastest 10%, or fastest gigabyte of memory components from among the memory components 112-1 to 112-N.

At operation 320, the power loss protection subsystem 113 allocates the portion of the memory components 112-1 to 112-N identified based on the ranking to non-volatile memory. In some embodiments, the non-volatile memory can include NAND flash memory, or SLC NAND flash memory.

Figure 4:
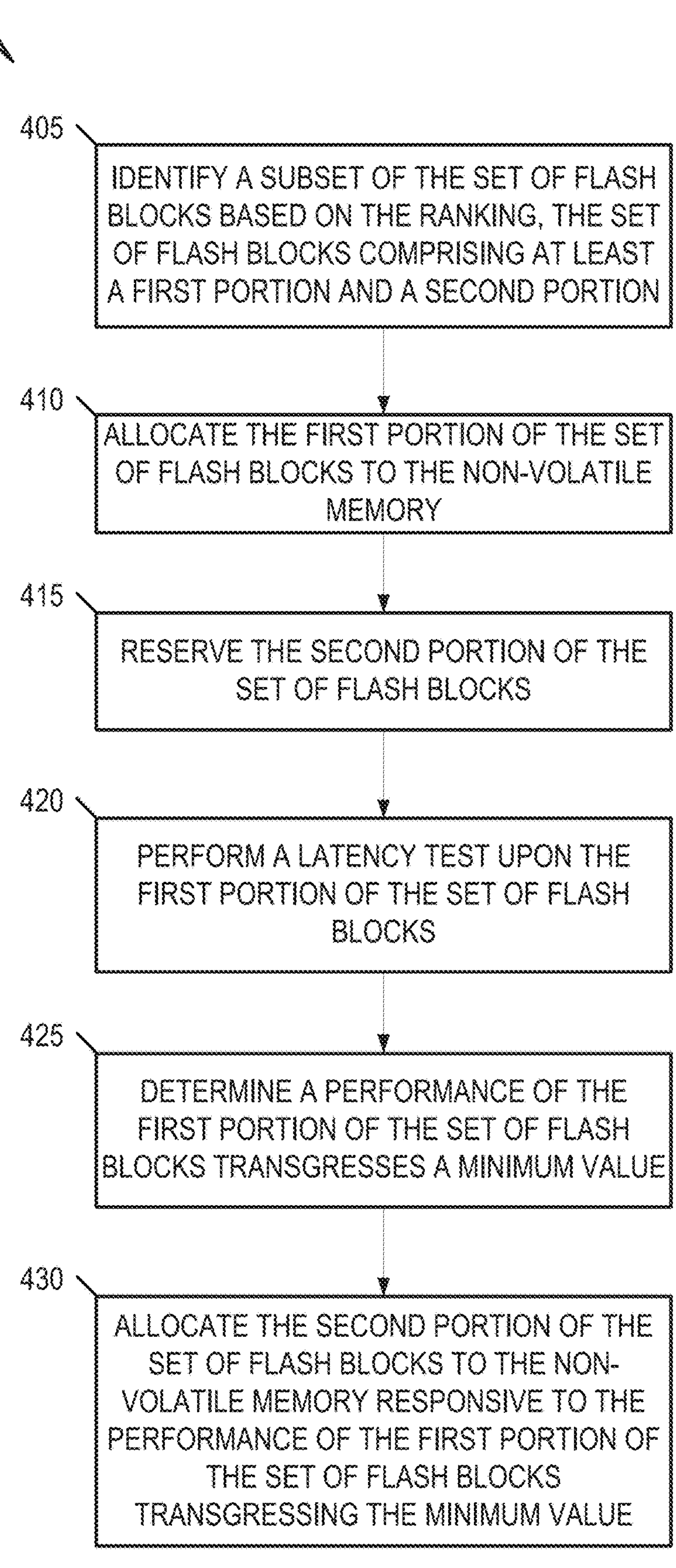
FIG. 4 is a flow diagram of an example method to allocate a portion of a memory sub-system for asynchronous power loss protection, in accordance with some embodiments of the present disclosure.

FIG. 4 is a flow diagram of an example method 400 to allocate a portion of a memory sub-system for asynchronous power loss protection, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the power loss protection subsystem 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As in the method 300 of FIG. 3, at operation 405, the power loss protection subsystem 113 identifies a subset of the memory components 112-1 to 112-N based on the corresponding rankings. For example, the power loss protection subsystem 113 can identify the top ranked 10%, or other quantity, of memory components from among the memory components 112-1 to 112-N.

At operation 410, a first portion of the top ranked memory components are allocated to non-volatile memory. For example, in embodiments where the top ranked gigabyte of the memory components 112-1 to 112-N are selected, the power loss protection component allocates a first portion of that gigabyte to the non-volatile memory (e.g., 400 megabytes).

At operation 415, the remaining portion of the subset of the memory components 112-1 to 112-N are reserved. For example, in the example embodiment discussed in reference to operation 410, the remaining 600 megabytes are placed on reserve by the power loss protection subsystem 113.

At operation 420, the power loss protection subsystem 113 performs a latency test upon the first portion of the memory components 112-1 to 112-N. In some embodiments, the program time test may be performed upon the memory components 112-1 to 112-N at a predetermined interval (e.g., every 2 weeks), responsive to a trigger event, such as powering up a device, or responsive to an explicit or implicit command receive from the host system 120.

At operation 425, based on the program time test, the power loss protection subsystem 113 determines that a performance of the first portion of the memory components 112-1 to 112-N transgresses a minimum threshold value. For example, in some embodiments the minimum threshold value defines a minimum performance required of the memory components from among the memory components 112-1 to 112-N allocated to the non-volatile memory.

Responsive to determining that the performance of the first portion of the memory components 112-1 to 112-N falls below the minimum threshold value, the power loss protection subsystem 113 allocates, or maps, a second portion from the reserve to non-volatile memory for asynchronous power loss protection. And unmaps, then retires or reallocates to a different function, the first portion that falls below the minimum threshold value for performance. By doing so, the power loss protection subsystem 113 ensures that the fastest and most reliable memory components are utilized for asynchronous power loss protection throughout the entire service lifetime of the system.

Figure 5:
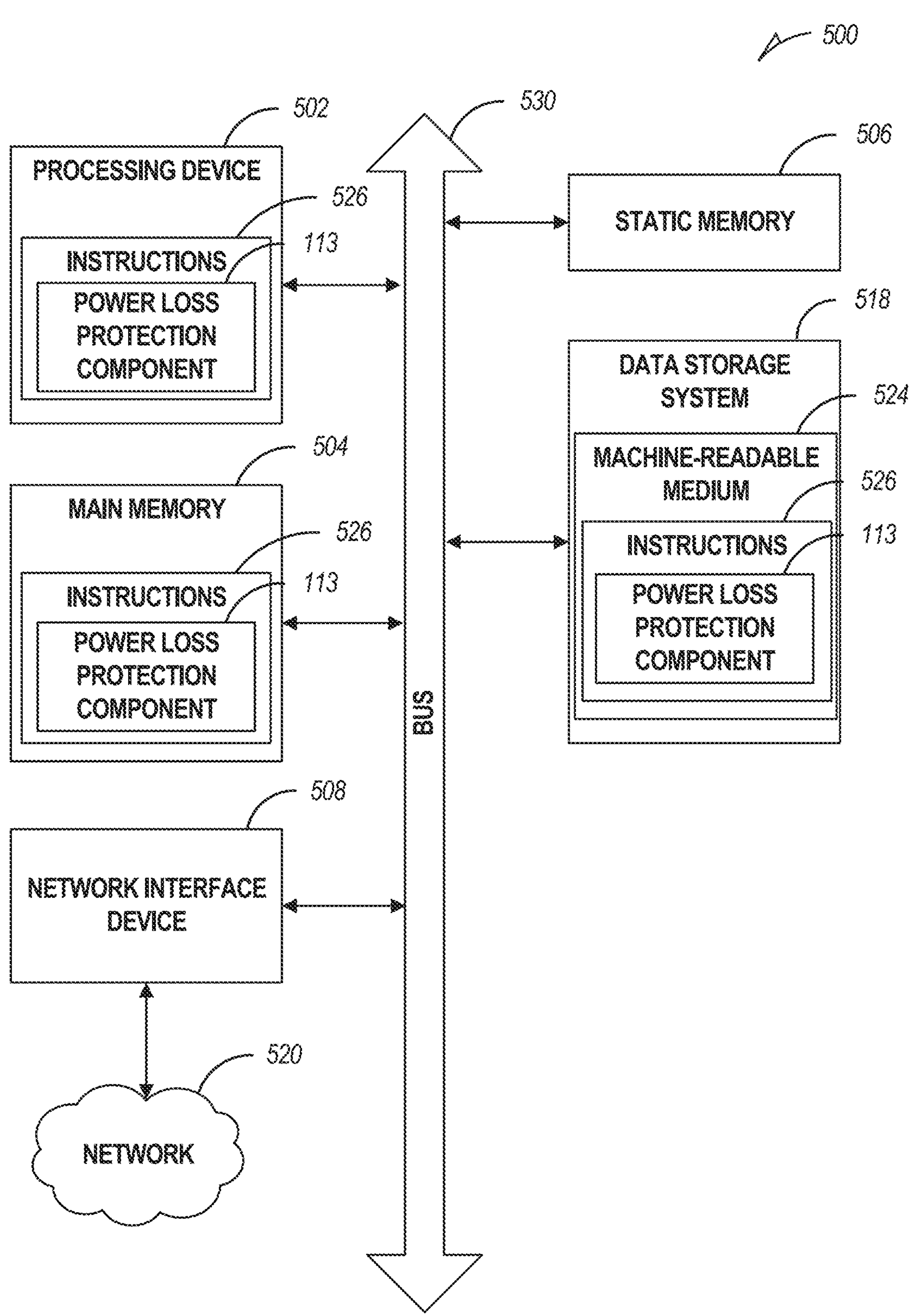
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the power loss protection subsystem 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an ASIC, a FPGA, a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a memory allocation system (e.g., the power loss protection subsystem 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and the like.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

EXAMPLES

Example 1 is a system comprising: a plurality of memory components; and a processing device, operatively coupled to the plurality of memory components, to: allocating a portion of the plurality of memory components to non-volatile memory, the memory component including a volatile cache; performing a write command of data to the volatile cache; detecting a trigger event at a device associated with the plurality of memory components; retrieving the data written to the volatile cache responsive to the detecting the trigger event at the device; and writing the data to the portion of the plurality of memory components allocated to the non-volatile cache.

In Example 2, the subject matter of Example 1, wherein the trigger event includes asynchronous power loss to one or more of the plurality of memory components.

In Example 3, the subject matter of any one or more of Examples 1 and 2 wherein the plurality of memory components optionally comprise a set of flash blocks, the portion of the plurality of memory components comprises a portion of the set of flash blocks, and the allocation the portion of the plurality of memory components to the non-volatile memory includes: performing a latency test upon the set of flash blocks; ranking the set of flash blocks based on the latency test;

- identifying the portion of the set of flash blocks based on the ranking; and
- allocating the portion of the set of flash blocks to the non-volatile memory in response to the identifying the portion of the set of flash blocks based on the ranking.

In Example 4, the subject matter of any one or more of Examples 1 through 3, wherein the ranking of the set of flash blocks based on the latency test includes: determining a tPROG speed of each flash block from among the set of flash blocks; and ranking the set of flash blocks based on the tPROG speed of each flash block.

In Example 5, the subject matter of any one or more of Examples 1 through 3, wherein the portion of the set of flash blocks includes at least a first block and a second block, and the allocating the portion of the set of flash blocks to the non-volatile memory includes: logically mapping the first block to the second block.

In Example 6, the subject matter of any one or more of Examples 1 through 3, wherein the performing the latency test upon the set of flash blocks optionally includes: causing the device to perform the latency test upon the set of flash blocks.

In Example 7, the subject matter of any one or more of Examples 1 through 3, wherein the portion of the set of flash blocks is a first portion, and the identifying the portion of the set of flash blocks based on the ranking includes: identifying a subset of the set of flash blocks based on the ranking, the subset of the set of flash blocks comprising at least the first portion and a second portion; allocating the first portion of the set of flash blocks to the non-volatile memory; reserving the second portion of the set of flash blocks; performing a latency test upon the first portion of the set of flash blocks; determining a performance of the first portion of the set of flash blocks transgresses a minimum value based on the latency test; and allocating the second portion of the set of flash blocks to the non-volatile memory responsive to the performance of the first portion of the set of flash blocks transgressing the minimum value.

In Example 8, the subject matter of Example 1, wherein the non-volatile memory comprises NAND flash memory that includes single-level cell NAND flash memory.

Example 9 is a method comprising allocating a portion of a memory component of a device to non-volatile memory, the memory component including a volatile cache; performing a write command of data to the volatile cache; detecting a trigger event at the device; retrieving the data written to the volatile cache responsive to the detecting the trigger event at the device; and writing the data to the portion of the memory component of the device allocated to the non-volatile memory.

In Example 10, the subject matter of Example 9, wherein the trigger event includes asynchronous power loss at the device.

In Example 11, the subject matter of Example 9, wherein the memory component comprises a set of flash blocks, the portion of the memory component comprises a portion of the set of flash blocks, and the allocation the portion of the memory component to the non-volatile memory includes: performing a latency test upon the set of flash blocks of the memory component; ranking the set of flash blocks based on the latency test; identifying the portion of the set of flash blocks based on the ranking; and allocating the portion of the set of flash blocks of the memory component to the non-volatile memory in response to the identifying the portion of the set of flash blocks based on the ranking.

In Example 12, the subject matter of Example 11, wherein the ranking the set of flash blocks based on the latency test includes: determining a tPROG speed of each flash block from among the set of flash blocks; and ranking the set of flash blocks based on the tPROG speed of each flash block.

In Example 13, the subject matter of Example 11, wherein the portion of the set of flash blocks includes at least a first block and a second block, and the allocating the portion of the set of flash blocks to the non-volatile memory includes: logically mapping the first block to the second block.

In Example 14, the subject matter of Example 11, wherein the performing the latency test upon the set of flash blocks of the memory component includes: causing the device to perform the latency test upon the set of flash blocks of the memory component.

In Example 15, the subject matter of Example 11, wherein the portion of the set of flash blocks is a first portion, and the identifying the portion of the set of flash blocks based on the ranking includes: identifying a subset of the set of flash blocks based on the ranking, the subset of the set of flash blocks comprising at least the first portion and a second portion; allocating the first portion of the set of flash blocks to the non-volatile memory; reserving the second portion of the set of flash blocks; performing a latency test upon the first portion of the set of flash blocks; determining a performance of the first portion of the set of flash blocks transgresses a minimum value based on the latency test; and allocating the second portion of the set of flash blocks to the non-volatile memory responsive to the performance of the first portion of the set of flash blocks transgressing the minimum value.

In Example 16, the subject matter of Example 9, wherein the non-volatile memory comprises NAND flash memory that includes single-level cell NAND flash memory.

Example 17, A non-transitory computer-readable storage medium comprising instructions that, when executed by a processing device, cause the processing device to perform operations comprising: allocating a portion of a memory component of a device to non-volatile memory, the memory component including a volatile cache; performing a write command of data to the volatile cache; detecting a trigger event at the device; retrieving the data written to the volatile cache responsive to the detecting the trigger event at the device; and writing the data to the portion of the memory component of the device allocated to the non-volatile memory.

In Example 18, the subject matter of Example 17, wherein the trigger event includes asynchronous power loss at the device.

In Example 19, the subject matter of Example 17, wherein the memory component comprises a set of flash blocks, the portion of the memory component comprises a portion of the set of flash blocks, and the allocation the portion of the memory component to the non-volatile memory includes: performing a latency test upon the set of flash blocks of the memory component; ranking the set of flash blocks based on the latency test; identifying the portion of the set of flash blocks based on the ranking; and allocating the portion of the set of flash blocks of the memory component to the non-volatile memory in response to the identifying the portion of the set of flash blocks based on the ranking.

In Example 20, the subject matter of Example 19, wherein the ranking the set of flash blocks based on the latency test includes: determining a tPROG speed of each flash block from among the set of flash blocks; and ranking the set of flash blocks based on the tPROG speed of each flash block.

What is claimed is:

1. A system comprising:

a plurality of memory components comprising non-volatile memory components and a volatile cache; and a processing device, operatively coupled with the plurality of memory components, configured to perform operations comprising:

detecting data written to the volatile cache;

identifying, from among multiple portions of the non-volatile memory components, a portion having a lower program latency relative to other portions of the non-volatile memory components based on a ranking of program latency of the multiple portions;

accessing the data written to the volatile cache; and moving the data to the portion of the non-volatile memory components.

2. The system of claim 1, wherein the identifying the portion of the non-volatile memory components based on the ranking includes:

performing a performance test upon the non-volatile memory components, the performance test including a latency test; and determining the program latency of each of the multiple portions based on the latency test.

3. The system of claim 2, wherein the latency test comprises determining a program time (tPROG) for each of the multiple portions.

4. The system of claim 1, wherein the identified portion comprises a single-level cell NAND flash memory.

5. The system of claim 1, wherein the portion of the non-volatile memory components is a first portion of the multiple portions, and the operations further comprise:

performing a latency test on the first portion;

determining that a program latency of the first portion exceeds a threshold;

identifying a second portion of the multiple portions having a lower program latency than the first portion;

moving the data to the second portion.

6. The system of claim 1, wherein the accessing the data written to the volatile cache includes:

detecting a trigger event; and accessing the data responsive to the trigger event.

7. The system of claim 6, wherein the trigger event includes an asynchronous power loss.

8. A method comprising:

a plurality of memory components comprising non-volatile memory components and a volatile cache; and a processing device, operatively coupled with the plurality of memory components, configured to perform operations comprising:

detecting data written to the volatile cache;

identifying, from among multiple portions of the non-volatile memory components, a portion having a lower program latency relative to other portions of the non-volatile memory components based on a ranking of program latency of the multiple portions;

accessing the data written to the volatile cache; and moving the data to the portion of the non-volatile memory components.

9. The method of claim 8, wherein the ranking the program latency comprises:

performing a performance test upon the non-volatile memory components, the performance test including a latency test; and determining a program latency for each of the multiple portions based on the latency test.

10. The method of claim 9, wherein the performing the latency-test includes determining a program time (tPROG) for each of the multiple portions.

11. The method of claim 8, wherein the identified portion comprises a single-level cell (SLC) region of the non-volatile memory components.

12. The method of claim 8, wherein the portion of the non-volatile memory components is a first portion, and the operations further comprise:

performing a latency test on the first portion;

determining that a program latency of the first portion exceeds a threshold;

identifying a second portion of the multiple portions having a lower program latency than the first portion; and moving the data to the second portion.

13. The method of claim 8, wherein the accessing the data written to the volatile cache includes:

detecting a trigger event; and accessing the data written responsive to the trigger event.

14. The method of claim 13, wherein the trigger event includes an asynchronous power loss.

15. A non-transitory computer-readable storage medium comprising instructions that, when executed by a processing device, cause the processing device to:

a plurality of memory components comprising non-volatile memory components and a volatile cache; and a processing device, operatively coupled with the plurality of memory components, configured to perform operations comprising:

detecting data written to the volatile cache;

identifying, from among multiple portions of the non-volatile memory components, a portion having a lower program latency relative to other portions of the non-volatile memory components based on a ranking of program latency of the multiple portions;

accessing the data written to the volatile cache; and moving the data to the portion of the non-volatile memory components.

16. The non-transitory computer-readable storage medium of claim 15, wherein the identifying the portion of the non-volatile memory components based on the ranking includes:

performing a performance test upon the non-volatile memory components, the performance test including a latency test; and determining the program latency of each of the multiple portions based on the latency test.

17. The non-transitory computer-readable storage medium of claim 16, wherein the latency test comprises determining a program time (tPROG) for each of the multiple portions.

18. The non-transitory computer-readable storage medium of claim 15, wherein the identified portion comprises a single-level cell.

19. The non-transitory computer-readable storage medium of claim 15, wherein the portion of the non-volatile memory components is a first portion of the multiple portions, and the operations further comprise:

performing a latency test on the first portion;

determining that a program latency of the first portion exceeds a threshold;

identifying a second portion of the multiple portions having a lower program latency than the first portion; and moving the data to the second portion.

20. The non-transitory computer-readable storage medium of claim 15, wherein the accessing the data written to the volatile cache includes:

detecting a trigger event; and accessing the data responsive to the trigger event.

* * * * *